United States Patent
Liou et al.

(10) Patent No.: US 6,864,192 B1
(45) Date of Patent: Mar. 8, 2005

(54) LANGMUIR-BLODGETT CHEMICALLY AMPLIFIED PHOTORESIST

(75) Inventors: Huey-Chiang Liou, Fremont, CA (US); Hai Deng, Mountain View, CA (US); Wang Yueh, Portland, OR (US); Hok-Kin Choi, San Jose, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/695,103

(22) Filed: Oct. 28, 2003

(51) Int. Cl.[7] ............................................. H01L 21/31
(52) U.S. Cl. ...................... 438/780; 438/782; 438/939; 257/643; 257/E21.024
(58) Field of Search ................. 438/780, 782, 438/939; 257/E21.024, 643

(56) References Cited

U.S. PATENT DOCUMENTS

| | | | | |
|---|---|---|---|---|
| 5,185,296 A | * | 2/1993 | Morita et al. | 438/694 |
| 5,512,328 A | * | 4/1996 | Yoshimura et al. | 427/498 |
| 5,795,699 A | * | 8/1998 | Zhou et al. | 430/318 |
| 6,280,911 B1 | * | 8/2001 | Trefonas, III | 430/326 |

FOREIGN PATENT DOCUMENTS

| | | | |
|---|---|---|---|
| JP | 04253059 A | * | 9/1992 |
| JP | 0905440 A | * | 2/1997 |

OTHER PUBLICATIONS

S. Elhadj, J. W. Woody, V. S. Niu and R. F. Saraf, *Orientation of self–assembled block copolymer cylinders perpendicular to electric field in mesoscale film*, Applied Physics Letters, vol. 82, No. 6, Feb. 10, 2003, p. 871–3.

Huiwen Liu, Bharat Bhushan, *Orientation and relocation of biphenyl thiol self–assembled monolayers under sliding*, Ultramicroscopy, vol. 91, No. 1–4, May 2002, p. 177–83.

Sang Jung Ahn, Yun Kyeong Jang, Haeseong Lee, and Haiwon Lee, *Mechanisim of atomic force microscopy anodization lithography on a mixed Langmuir–Blodgette resist of palmitic acid and hexadecylamine on silicon*, Applied Physics Letters, vol. 80, No. 14, Apr. 8, 2002, p. 2592–4.

Tiesheng Li, Masaya Mitsuishi, and Tokuji Miyashita, *Photodegradable polymer LB films for nano–lithographic imaging techniques*, Thin Solid Films, vol. 389, No. 1–2, Jun. 15, 2001, p. 267–71.

N.G. Semaltianos, H. Araujo, and E.G. Wilson, *Polymerization of Langmuir–Blodgett films of diacetylenes*, Surface Science, vol. 460, No. 1–3, Jul. 20, 2000, p. 182–9.

Hiroyuki Sugimura, Atsushi Hozumi and Osamu Takai, *Fabrication of Coplanar Microstructures Composed of Multiple Organosilane Self–Assembled Monolayers*, IEICE Transactions on Electronics, vol. E83–C, No. 7, Jul. 2000, p. 1099–103.

M. Sundermann, J. Hartwich, K. Rott, D. Meyners, E. Majkova, U. Kleineberg, M. Grunze, U. Heinzmann, *Nanopatterning of Au absorber films on Mo/Si EUV multilayer mirrors by STM lithography in self–assembled monolayers*, Surface Science, vol. 454–456, May 20, 2000, p. 1104–9.

Primary Examiner—Trung Dang
(74) Attorney, Agent, or Firm—Trop, Pruner & Hu, P.C.

(57) ABSTRACT

A Langmuir-Blodgett film may be utilized as a chemically amplified photoresist layer. Langmuir-Blodgett films have highly vertically oriented structures which may be effective in reducing line edge or line width roughness in chemically amplified photoresists.

15 Claims, 2 Drawing Sheets

OTHER PUBLICATIONS

Richard D. Peters, Xiao M. Yang, Tae K. Kim, B. H. Sohn, and Paul F. Nealey, *Using Self–Assembled Monolayers Exposed to X–rays To Control the Wetting Behavior of Thin Films of Diblock Copolymers,* Langmuir, vol. 16, No. 10, May 16, 2000, p. 4625–31.

Hiroyuki Sugimura, Kazuya Ushiyama, Atsushi Hozumi, and Osamu Takai, *Micropatterning of Alkyl– and Fluoro-alkylsilane Self–Assembled Monolayers Using Vacuum Ultraviolet Light,* Langmuir, vol. 16, No. 3, Feb. 8, 2000, p. 885–8.

Hiroyuki Maruyama, Nobuyuki Kosai, Tadatake Sato, Shigehito Sagisaka, Hiroshi Segawa, Takeo Shimidzu and Kazuyoshi Tanaka, *Nanometer–Scale Lithography on the Oligosilane Langmuir–Blodgett Film,* Japanese Journal of Applied Physics, Part 1, vol. 36, No. 12A, Dec. 1997, p. 7312–16.

Chang Nam Kim, Dong Woo Kang, Eung Ryul Kim, and Haiwon Lee, *Fabrication of a Polymethylphenylmethacrylate Resist by Using Electron Beam Lithography,* Journal of the Korean Physical Society, vol. 31, No. 1, Jul. 1997, p. 154–7.

T. Sato, and H. Ahmed, *Observation of a Coulomb staircase in electron transport through a molecularly linked chain of gold colloidal particles,* Applied Physics Letters, vol. 70, No. 20, May 19, 1997, p. 2759–61.

Earl T. Ada, Luke Hanley, Sergei Etchin, John Melngailis, Walter J. Dressick, Mu–San Chen and Jeffrey M. Calvert, *Ion beam modification and patterning of organosilane self-f–assembled monolayers,* Journal of Vacuum Science & Technology B, vol. 13, No. 6, Nov.–Dec. 1995, p. 2189–96.

\* cited by examiner

US 6,864,192 B1

LANGMUIR-BLODGETT CHEMICALLY AMPLIFIED PHOTORESIST

BACKGROUND

This invention relates generally to techniques for manufacturing semiconductor integrated circuits.

In the manufacture of semiconductor integrated circuits, a photoresist film is formed over a semiconductor wafer. The photoresist film may be irradiated so that some regions of the photoresist film are either harder or easier to remove. As a result, a pattern can be repeatedly transferred to the semiconductor wafer via the photoresist film. After developing, the photoresist film may be used as a mask for etching desired features in the underlying layers of the semiconductor wafer.

Advances in photolithography techniques utilized to transfer patterns to photoresist have enabled increasingly smaller patterns to be transferred. This means that smaller integrated circuit features can be formed in integrated circuits. As a result, more elements can be put in a given area on the semiconductor integrated circuit. One result of these advances has been to reduce the cost of integrated circuits.

Photolithographic advances have allowed progressively smaller irradiation wavelengths to be used. For example, deep or extreme ultraviolet wavelengths on the order of 190–315 nanometers may be used with chemically amplified photoresists. Chemically amplified photoresists use a photoacid generator and an acid sensitive polymer.

While advances in photolithography have been progressing at an impressive rate, other problems associated with photolithography have not been proceeding at a corresponding pace. One such issue arises with respect to line edge or line width roughness. Line edge or width roughness is roughness on the edge surfaces of the patterned photoresist. This roughness may be transferred to the underlying etched layers. When those etched layers form integrated circuit transistors, those transistors may have leakage problems.

In chemically amplified photoresist systems, photoacid generator diffusion during the post-exposure bake, as well as polymer chain non-uniformity, may result in line edge roughness problems. In other words, the diffusion of the photoacid generator during the post-exposure bake may continue to remove some portion of the photoresist outside the region which is defined by the pattern transferred to the photoresist.

Thus, it is desirable to reduce the roughness associated with the transfer of patterns to chemically amplified photoresist.

DETAILED DESCRIPTION

One way to reduce photoresist edge roughness, including line edge and line width roughness, is to form highly vertically ordered photoresist molecules. If the photoresist molecules are vertically oriented, they have less extent in the horizontal direction. Thus, as those molecules are removed during photoresist patterning, in one embodiment, relatively clean photoresist edges are formed.

A vertically ordered molecular structure may be obtained using a Langmuir-Blodgett film. Carboxylic acids and their salts may be utilized to form Langmuir-Blodgett films, because these molecules may include a hydrophobic hydrocarbon chain with a hydrophilic acid head group. A hydrophilic head group may be attracted to water, while the hydrophobic chain is repelled from water. Thus, when a film of carboxylic acid is spread over a water surface, the molecules tend to stand on their hydrophilic heads with their hydrophobic tails extending upwardly.

Figure 1:
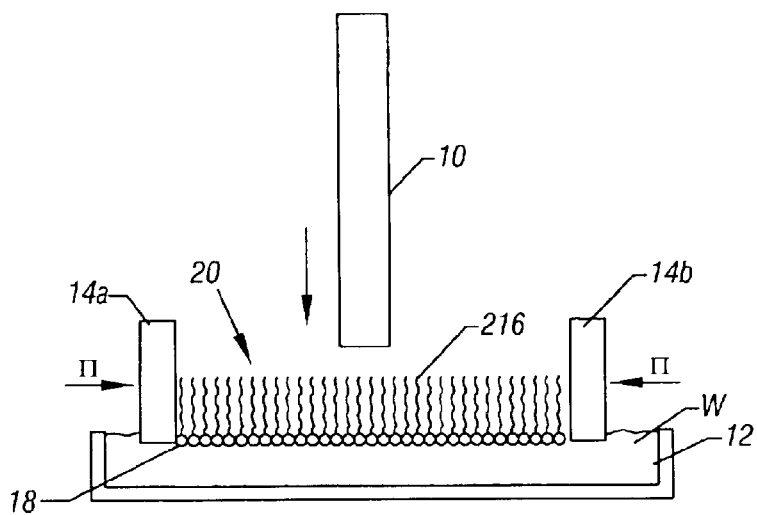
FIG. 1 is a front elevational view of one embodiment of the present invention at one position.

Thus, a plurality of Langmuir-Blodgett molecules 16 may be arranged on a water surface W within a container 12, as shown in FIG. 1. The hydrophilic heads 18 touch the water surface, while the hydrophilic tails 26 extend upwardly away from the water surface W. A film may be formed by providing horizontal barriers 14a and 14b and moving those barriers 14 toward one another as indicated by the arrows.

Langmuir-Blodgett molecules initially tend to be loosely packed in a gas phase. As the barriers 14 move together, the pressure starts to increase more rapidly at some point. As a result of a change in compressibility, a liquid phase may form without long range order. As the barriers 14 are brought closer together, a solid phase transition may be achieved to form a film 20.

A semiconductor wafer 10 may then be moved downwardly, as indicated by the arrow next to the wafer 10, into the Langmuir-Blodgett film 20 on the water surface W. A surface treatment on the backside and frontside of the wafer 10 may be provided so that only the front side of the wafers attracts the Langmuir-Blodgett film 20. The hydrophilic head groups 18 attach to the wafer 10 surface and the hydrophobic tails 26 stand outwardly in the opposite direction.

Figures 2, 3:
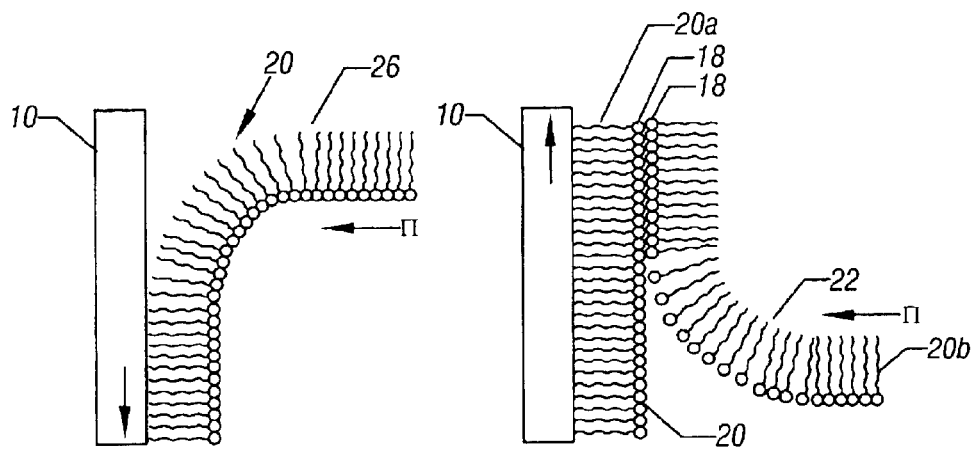
FIG. 2 is a front elevational view of a portion of the embodiment shown in FIG. 1 at a subsequent position.
FIG. 3 is a front elevational view of a portion of the embodiment shown in FIG. 2 at a subsequent stage in accordance with one embodiment of the present invention.

The photoresist molecules then are self-assembled in the scale of monolayer as indicated in FIG. 2. As the wafer 10 moves downwardly into the film 20, hydrophobic tails 26 attach to the semiconductor wafer surface 10. The hydrophobic tails 26 are attracted to the hydrophobic substrate 10 in one embodiment. Thus, in one embodiment, the wafers 10 may be coated on one side with a hydrophobic substrate to attract the hydrophobic tails 26 and the other side may be otherwise coated.

Referring to FIG. 3, after the layer 20a has been coated on one side of the wafer 10, the process may be repeated, reinserting the wafer 10 so that the hydrophilic heads 18 of the layer 20a are attracted to the hydrophilic heads 18 of another Langmuir-Blodgett layer 20b, as shown in FIG. 3.

Figure 4:
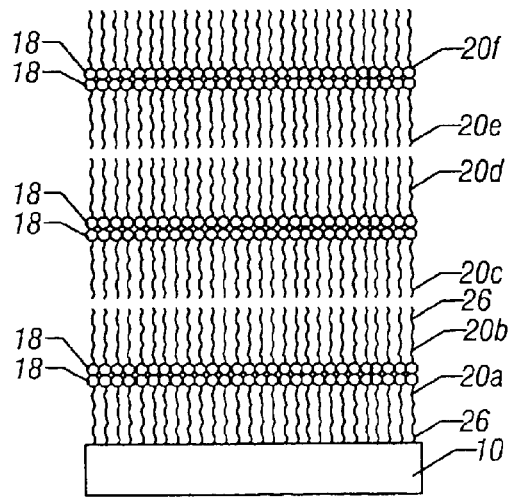
FIG. 4 is a front elevational view of a semiconductor structure in accordance with one embodiment of the present invention.

By repeatedly dipping the wafer 10 within the water W, a number of layers 20 may be built up as shown in FIG. 4. The first layer 20a may have hydrophobic tails 26 attached to the substrate 10. The next layer 20b may have its; hydrophilic heads 18 attracted to the hydrophilic heads 18 of the underlying layer 20a to form a layer 20b. On the next dip, the hydrophobic heads 26 of the layer 20b are attracted to the hydrophobic heads 26 of another layer 20c and so on to form any desired number of layers.

As can be readily appreciated from FIG. 4, the resulting photoresist film 20 is highly vertically oriented. This vertical orientation and alignment of molecules may be used to improve line edge and line width roughness. As a result, the photoresist may cleave on the scale of a monolayer, achieving smooth surfaces at the point of cleavage and reducing roughness.

The resulting photoresist molecules contain a chemically bonded photoacid generator. The use of the Langmuir-Blodgett method to deposit highly oriented photoresist molecules controls the photoacid generator distribution in the photoresist and the subsequent diffusion paths during exposure processes. The Langmuir-Blodgett molecule may include a chemically amplified component for chemically amplified 193 and 248 nanometer photoresists in one embodiment of the present invention.

Figure 5:
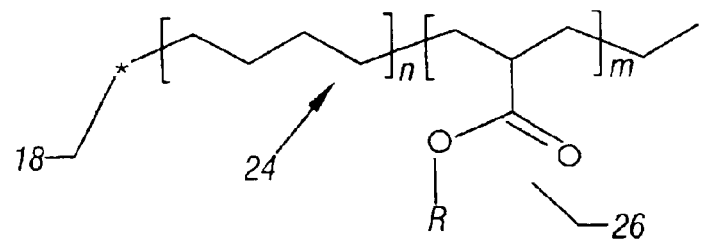
FIG. 5 is a schematic depiction of a photoresist molecule in accordance with one embodiment of the present invention.

Referring to FIG. 5, in accordance with one embodiment of the present invention, the individual molecules 24, making up a film 20, may have a hydrophilic head 18 and a hydrophobic tail 26. The hydrophobic tail 26 may be in the form of a carboxylic acid. The chain forming the molecule 24 may have repeating groups indicated by n and m, which may be a carbon chain. Examples of the molecules 24 include: polystyrene-polyisoprene-polystyrene triblock (Applied Physics Letters, vol. 82, no. 6, 10 Feb. 2003. p. 871–3); biphenyl thiol (BPT) (Ultramicroscopy, vol. 91, no. 1–4, May 2002. p. 177–83); palmitic acid and hexadecylamine (Applied Physics Letters, vol. 80, no. 14, 8 Apr. 2002. p. 2592–4); N-dodecylacrylamide (DDA), which is known to form a stable monolayer, and a photodegradable monomer, tert-butyl-4-vinylphenyl carbonate (tBVPC) (Thin Solid Films, vol. 389, no. 1–2, 15 Jun. 2001. p. 267–71); pentacosadiyinoic acid (Surface Science, vol. 460, no. 1–3, 20 Jul. 2000. p. 182–9); alkyl and fluoroalkyl groups, alkylsilane, that is, octadecyltrimethoxysilane or a fluoroalkylsilane (IEICE Transactions on Electronics, vol.E83-C, no. 7, July 2000, p. 1099–103); hexadecanthiol molecules (Surface Science, vol. 454–456, 20 May 2000. p. 1104–9); poly(styrene-block-methyl methacrylate) (Langmuir, vol. 16, no. 10, 16 May 2000. p. 4625–31); octadecyltrimethoxysilane, and a fluoroalkylsilane, that is, 1H,1H,2H,2H-perfluorodecyltrimethoxysilane (Langmuir, vol. 16, no. 3, 8 Feb. 2000. p. 885–8); poly(methylphenylmethacrylate) (Japanese Journal of Applied Physics, Part 1 (Regular Papers, Short Notes & Review Papers), vol. 36, no. 12A, December 1997. p. 7312–16); tridecamethylhexasilanylacetic acid (Journal of the Korean Physical Society, vol. 31, no. 1, July 1997. p. 154–7); polymethylphenylmethacrylate, poly (methylphenylmethacylate)-co-(methylmethacrylate) (Journal of the Korean Physical Society, vol. 31, no. 1, July 1997. p. 154–7); aminosilane [3-(2-aminoethylamino)propyltrimethoxysilane] (Applied Physics Letters, vol. 70, no. 20, 19 May 1997. p. 2759–61) or N-(2-aminoethyl)-3-aminopropyltrimethoxysilane, (aminoethylaminomethyl) phenethyltrimethoxysilane, and pyridine monolayers, phenethyltrimethoxysilane and pyridine (Journal of Vacuum Science & Technology B (Microelectronics and Nanometer Structures), vol. 13, no. 6, November-December 1995. p. 2189–96).

Figure 6:
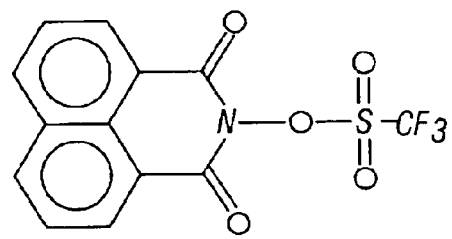
FIG. 6 is a schematic chemical depiction of a photoacid generator useful in the molecule of FIG. 5 in accordance with one embodiment of the present invention.
Figure 7:
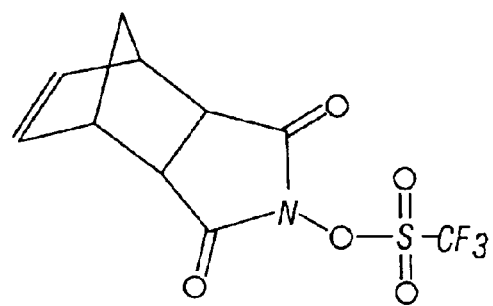
FIG. 7 is a schematic chemical depiction of still another photoacid generator in accordance with one embodiment of the present invention.

The moiety R may be a non-ionic photoacid generator and protection group such as alpha-(trifluoromethylsulfonyloxy)-bicyclo[2.2.1] hept-5-ene-2-3-dicarboximide (MDT) as shown in FIG. 6 or the moiety shown in FIG. 5, known as NIT, as another example.

In accordance with some embodiments of the present invention, the use of the Langmuir-Blodgett films may form the entire photoresist layer. In accordance with another embodiment of the present invention, the Langmuir-Blodgett film may form an upper portion of a photoresist layer and a conventional photoresist material may be utilized underneath the Langmuir-Blodgett film.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. A semiconductor structure comprising:

a semiconductor substrate; and a Langmuir-Blodgett chemically amplified photoresist, including a non-ionic photoacid generator bonded to the hydrophobic region of an amphipathic molecule, formed over said semiconductor substrate.

2. The structure of claim 1 wherein said photoresist includes a non-ionic photoacid generator.

3. The structure of claim 2 wherein said photoacid generator is MDT.

4. The structure of claim 2 wherein said photoacid generator is NIT.

5. The structure of claim 1 wherein said photoresist is 193 nanometer photoresist.

6. The structure of claim 1 wherein said photoresist is 248 nanometer photoresist.

7. A method comprising:

forming a Langmuir-Blodgett chemically amplified photoresist over a semiconductor substrate, said photoresist including a non-ionic photoacid generator bonded to the hydrophobic region of an amphipathic molecule.

8. The method of claim 7 including a non-ionic photoacid generator in said photoresist.

9. The method of claim 8 including MDT as said photoacid generator.

10. The method of claim 8 including NIT as said photoacid generator.

11. The method of claim 7 including forming a 193 nanometer photoresist.

12. The method of claim 7 including forming a 248 nanometer photoresist.

13. A semiconductor structure comprising:

a semiconductor substrate; and

A Langmuir-Blodgett chemically amplified photoresist over said substrate, said chemiclly amplified photoresist including a non-ionic photoacid generator bonded to the hydrophobic region of an amphipathic molecule and an acid sensitive polymer.

14. The structure of claim 13 wherein said photoacid generator is MDT.

15. The structure of claim 13 wherein said photoacid generator is NIT.

* * * * *